(12) United States Patent
Shim et al.

(10) Patent No.: US 11,735,396 B2
(45) Date of Patent: Aug. 22, 2023

(54) INDUCTIVELY COUPLED PLASMA PROCESSING APPARATUS

(71) Applicant: Samsung Electronics Co., Ltd., Suwon-si (KR)

(72) Inventors: Seung Bo Shim, Seoul (KR); Doug Yong Sung, Seoul (KR); Ho-Jun Lee, Busan (KR); Jee Hun Jeong, Busan (KR); Sung Hwan Cho, Busan (KR); Ju-Hong Cha, Busan (KR)

(73) Assignees: SAMSUNG ELECTRONICS CO., LTD., Suwon-si (KR); PUSAN NATIONAL UNIVERSITY INDUSTRY-UNIVERSITY COOPERATION FOUNDATION, Busan (KR)

( * ) Notice: Subject to any disclaimer, the term of this patent is extended or adjusted under 35 U.S.C. 154(b) by 219 days.

(21) Appl. No.: 17/148,037

(22) Filed: Jan. 13, 2021

(65) Prior Publication Data
US 2022/0005671 A1    Jan. 6, 2022

(30) Foreign Application Priority Data

Jul. 2, 2020    (KR) .......................... 10-2020-0081626

(51) Int. Cl.
*H01J 37/32* (2006.01)

(52) U.S. Cl.
CPC ....... *H01J 37/3211* (2013.01); *H01J 37/3244* (2013.01); *H01J 37/32119* (2013.01)

(58) Field of Classification Search
CPC .............. H01J 37/3211; H01J 37/3244; H01J 37/32119; H01J 37/32715; H01J 37/32669
See application file for complete search history.

(56) References Cited

U.S. PATENT DOCUMENTS

| 8,597,463 B2 | 12/2013 | Sasaki | |
|---|---|---|---|
| 2002/0002947 A1* | 1/2002 | Satoyoshi | H01J 37/321 156/345.48 |
| 2007/0264441 A1* | 11/2007 | Ishibashi | H01J 37/32238 118/723 MW |
| 2008/0283500 A1 | 11/2008 | Motokawa | |
| 2012/0152901 A1* | 6/2012 | Nagorny | H01J 37/3211 216/68 |
| 2014/0116335 A1* | 5/2014 | Tsuji | H01L 21/02348 134/1.1 |
| 2017/0207099 A1* | 7/2017 | Ohtake | H01J 37/32183 |

(Continued)

FOREIGN PATENT DOCUMENTS

| JP | 4895920 B2 | 3/2012 |
|---|---|---|
| JP | 2018088336 A | 6/2018 |

(Continued)

*Primary Examiner* — Tung X Le
(74) *Attorney, Agent, or Firm* — Fish & Richardson P.C.

(57) ABSTRACT

An inductively coupled plasma processing apparatus includes a lower chamber providing a space for a substrate, a high-frequency antenna that generates inductively coupled plasma in the lower chamber, dielectric windows disposed between the lower chamber and the high-frequency antenna, metal windows alternatingly disposed between the dielectric windows, and gas inlet pipes disposed in each of the metal windows, wherein each of the gas inlet pipes includes nozzles that introduce gases to the lower chamberamber.

20 Claims, 17 Drawing Sheets

(56) References Cited

U.S. PATENT DOCUMENTS

2017/0365444 A1*  12/2017  Kim .................. H01J 37/32119
2019/0080948 A1*   3/2019  Lee ........................ H01L 21/68
2020/0227236 A1*   7/2020  Saito ........................ H01Q 1/26

FOREIGN PATENT DOCUMENTS

| JP | 6551673 B2 | 7/2019 |
| KR | 20100054613 A | 5/2010 |
| KR | 101547189 B1 | 8/2015 |

* cited by examiner

INDUCTIVELY COUPLED PLASMA PROCESSING APPARATUS

CROSS-REFERENCE TO RELATED APPLICATION

This application claims the benefit of Korean Patent Application No. 10-2020-0081626 filed on Jul. 2, 2020 in the Korean Intellectual Property Office, the subject matter of which is hereby incorporated by reference.

BACKGROUND

1. Technical Field

Embodiments of the inventive concept relate generally to inductively coupled plasma (ICP) processing apparatuses.

2. Description of the Related Art

A plasma processing apparatus may be used during the fabrication of a semiconductor substrate or a liquid crystal display (LCD). The plasma processing apparatus may activate a reactive gas in order to create a plasma-state reactive gas. This allows predetermined portion(s) of a semiconductor substrate to be processes by cations or radicals of the plasma-state reactive gas. The plasma processing apparatus may be used, for example, as a plasma enhanced chemical vapor deposition (PECVD) apparatus to deposit a thin film, an etching apparatus to etch and/or pattern a deposited thin film, a sputtering apparatus, an ashing apparatus, etc.

Plasma sources for plasma processing apparatus(es) include, for example, a capacitive coupled plasma (CCP) source, an induced coupled plasma (ICP) source, an electron cyclotron resonance (ECR) plasma source using microwaves, a surface wave plasma (SWP) source, etc.

Here, the capacitive coupled plasma source may apply radio frequency (RF) power to parallel and opposing plate electrodes in order to generate plasma according to an RF electric field formed between the plate electrodes. The induced coupled plasma source may create a plasma-state reactive gas using an electric field induced by an antenna to which high-frequency power is applied.

The induced coupled plasma processing apparatus uses an induced coupled plasma source allowing gas(es) to be injected through pipes surrounding a chamber (e.g., in a toroidal ring). Alternately, gas(es) may be injected through windows of an inductively coupled plasma processing apparatus. However, many gas injection approaches may reduce the uniformity of gas distribution within the chamber of the inductively coupled plasma processing apparatus.

SUMMARY

Embodiments of the inventive concept provide inductively coupled plasma (ICP) processing apparatus(es) providing improved uniformity of gas distribution within a processing chamber.

According to an embodiment of the inventive concept, there is provided an inductively coupled plasma processing apparatus including; a lower chamber providing a space for a substrate, a high-frequency antenna configured to generate inductively coupled plasma in the lower chamber, dielectric windows disposed between the lower chamber and the high-frequency antenna, metal windows alternatingly disposed between the dielectric windows, and gas inlet pipes disposed in each of the metal windows, wherein each of the gas inlet pipes includes nozzles configured to introduce gases to the lower chamber.

According to an embodiment of the inventive concept, there is provided an inductively coupled plasma processing apparatus including a chamber including an upper chamber and a lower chamber, wherein the lower chamber provides a space for a substrate, and a first plane separating the upper chamber from the lower chamber. Here, the first plane includes dielectric windows, metal windows alternatingly arranged with the dielectric windows, a high-frequency antenna configured to generate inductively coupled plasma in the lower chamber and disposed on the dielectric windows, gas inlet pipes respectively disposed in each of the metal windows, and nozzles respectively configured to introduce gases into the lower chamber.

According to an embodiment of the inventive concept, there is provided an inductively coupled plasma processing apparatus including; a substrate support supporting a substrate in a lower chamber, high-frequency antennas configured to generate inductively coupled plasma in the lower chamber, dielectric windows disposed below the high-frequency antennas, and metal windows disposed between the dielectric windows, gas inlet pipes disposed in each of the metal windows. and nozzles connected to each of the gas inlet pipes and configured to spray gases into the lower chamber towards the substrate.

BRIEF DESCRIPTION OF THE DRAWINGS

The above and other embodiments and features of the inventive concept will become more apparent upon consideration of the following detailed description taken together with the accompanying drawings, in which.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc. In this regard, certain drawings may include a set of X, Y and Z directional coordinates to improve descriptive clarity. However, those skilled in the art will recognize that such arbitrary directional coordinates are merely exemplary in nature.

Figure 1:
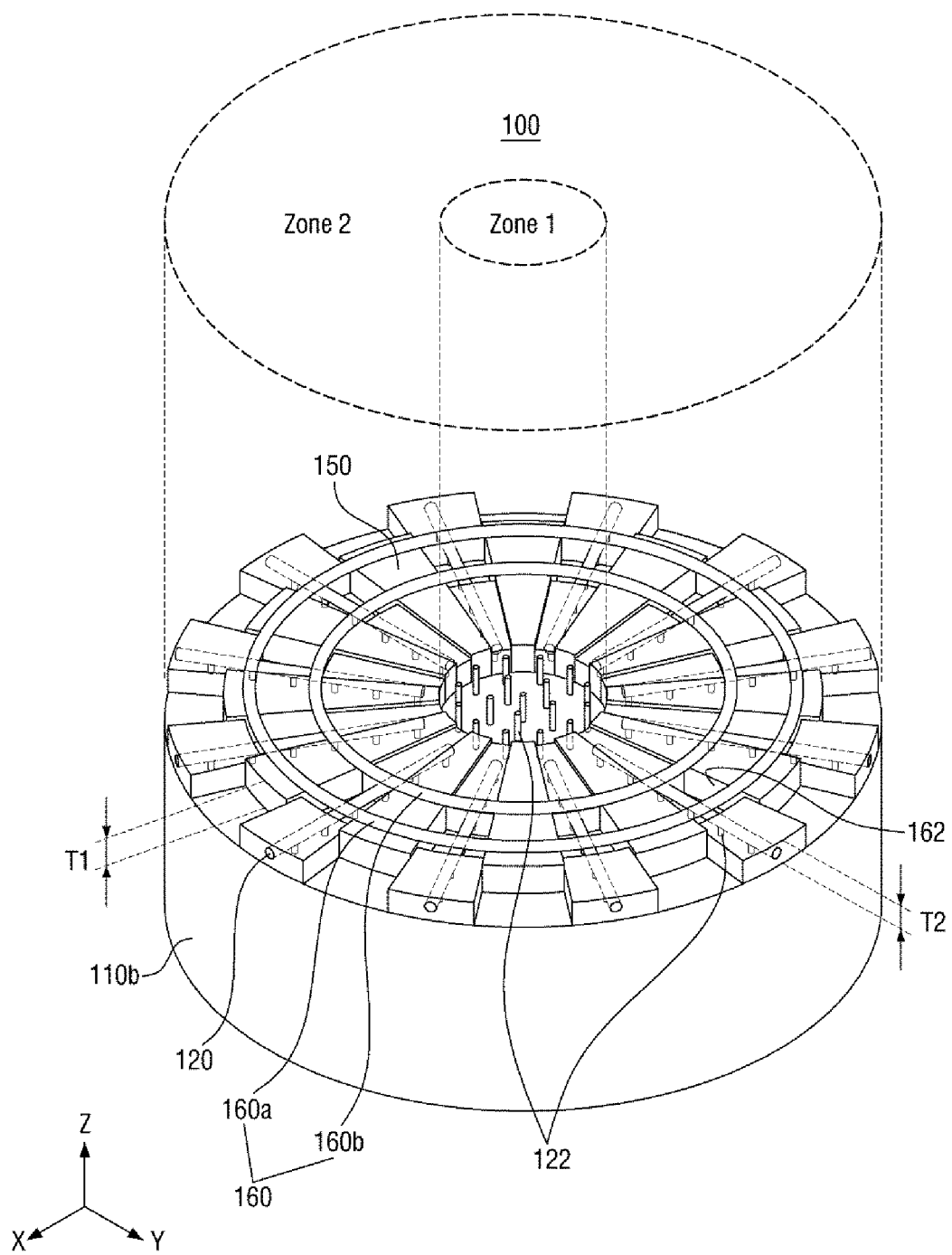
FIG. 1 illustrates an inductively coupled plasma (ICP) processing apparatus according to some embodiments of the present disclosure.
Figure 2:
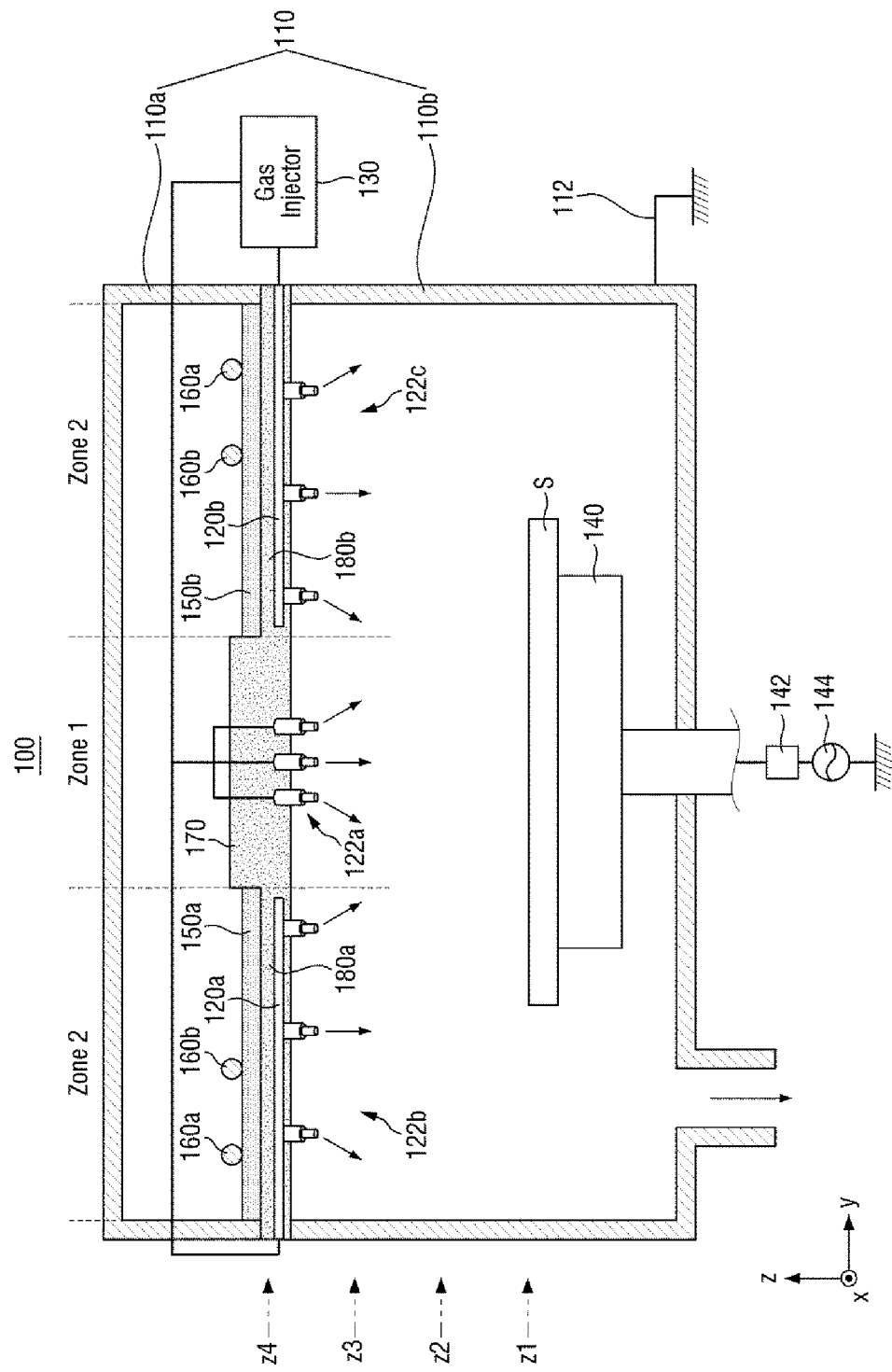
FIG. 2 is a cross-sectional view of the inductively coupled plasma processing apparatus of FIG. 1, as viewed from one direction (i.e., the first direction x)

Figure (FIG. 1 is a perspective diagram illustrating an inductively coupled plasma (ICP) processing apparatus 100 according to embodiments of the inventive concept, and FIG. 2 is a cross-sectional view (in the X direction) of the inductively coupled plasma processing apparatus 100.

Referring to FIGS. 1 and 2, the inductively coupled plasma processing apparatus 100 may include a chamber 110 (including an upper chamber 110a and a lower chamber 110b), gas inlet pipes 120, nozzles 122, dielectric windows 150, at least one high-frequency antenna (e.g., first and second high-frequency antennas 160a and 160b), and metal windows 180.

For improved clarity, only the lower chamber 110b is illustrated in FIG. 1, but the upper chamber 110a may be disposed on the lower chamber 110b. (See, e.g., FIG. 2).

The lower chamber 110b may be formed of one or more conductive material(s) such as, for example, aluminum (Al) or an Al alloy having an anodized inner wall surface. The lower chamber 110b may be configured to be readily assembled/disassembled, and to provide sufficient space (volume) in which one or more plasma process(es) may be performed. The chamber 110 may have a cylindrical shape, but those skilled in the art will recognize that the lower chamber 110 may be otherwise shaped. However, hereinafter, the chamber 110 will be assumed to have a cylindrical shape.

Various dielectric windows 150 and metal windows 180 may be disposed on the lower chamber 110b. Specifically, the dielectric windows 150 and the metal windows 180 may be disposed on a first plane (e.g., a lateral plane defined in the X and Y directions). Here, the first plane may be located closer to a top portion of the lower chamber 110b than a bottom portion of the lower chamber 110b.

In some embodiments, the dielectric windows 150 and the metal windows 180 may be alternately arranged. That is, one or more metal windows 180 may be disposed between the dielectric windows 150, and/or one or more dielectric windows 150 may be disposed between the metal windows 180.

Assuming that the first plane has a circular shape, each of the dielectric windows 150 and each of the metal windows 180 may have a pie section (or sector) shape arranged around a common center point. Alternately, the dielectric windows 150 and the metal windows 180 may be alternately arranged around a centrally-disposed hole of a donut shape.

The high-frequency antennas 160a and 160b may be disposed on the dielectric windows 150 and the metal windows 180. Although not specifically illustrated in FIGS. 1 and 2, the high-frequency antennas 160a and 160b may receive high-frequency RF power from an external power source.

In the illustrated example of FIG. 1, two (2) annular (or ring-shaped) high-frequency antennas are shown, but the number, shape and disposition high-frequency antenna(s) is a matter of particular design. However, in the illustrated example of FIG. 1, the high-frequency antennas 160a and 160b may be disposed such that they contact the dielectric windows 150, but do not contact the metal windows 180. In this manner, the high-frequency antennas 160a and 160b may be supported by the dielectric windows 150 when a first thickness T1 (in the Z direction) of the dielectric windows 150 is greater than a second thickness T2 of the metal windows 180. With this configuration, gaps (e.g., respective antenna cavities 162) may be formed between the high-frequency antennas 160 and 160b and the metal windows 180.

Since the high-frequency antennas 160a and 160b are insulated from the metal windows 180, an induced electric field may be generated by the high-frequency antennas 160a and 160b may not be communicated (or transmitted) to the metal windows 180. Accordingly, the transmitting efficiency of the induced electric field generated by the high-frequency antennas 160a and 160b in the lower chamber 110b may be improved.

In this regard, the dielectric windows 150 may be formed of one or more insulating material(s), such as a ceramic or a quartz material allowing the induced electric field to be generated by the high-frequency antennas 160a and 160b and transmitted to the lower chamber 110b. In some embodiments, the dielectric windows 150 may be formed of high-purity (e.g., 99.9%) $Al_2O_3$, thereby maximizing the intensity of the induced electric field generated by the high-frequency antennas 160a and 160b.

As illustrated in FIGS. 1 and 2, plasma may be generated in the lower chamber 110b under the influence of an electric field induced by the high-frequency antennas 160a and 160b. In this regard, the inductively coupled plasma processing apparatus 100 may further include, a metal frame 170 and a gas injector 130.

As noted above, the chamber 110, including the lower chamber 110b and the upper chamber 110a, may be formed of one or more conductive material(s) such as, for example, Al or an Al alloy having its inner wall surface anodized. That is, the upper chamber 110a and the lower chamber 110b may be integrally formed into the chamber 110, but may be configured to be readily assembled and disassembled. When assembled, the chamber 110 provides a space in which a plasma process may be performed (e.g.,) on a target substrate S. The upper chamber 110*a* may encase the metal windows 180*a* and 180*b*, the dielectric windows 150*a* and 150*b*, and the high-frequency antennas 160*a* and 160*b*, which are disposed on the lower chamber 110*b*.

The lower chamber 110*b* may be grounded by a ground line 112. Although not specifically illustrated in FIG. 2, a vacuum pump may be connected to a lower part or a side of the chamber 110 in order to place the spaced provided by the chamber 110 placed in a vacuum state. An exhaust port may also be formed to exhaust residual gas(es) from the chamber 110 following execution of a plasma process on the substrate S.

To perform a plasma process on a relatively large-sized substrate S, the size of the dielectric windows 150*a* and 150*b* may be increased, and the metal windows 180*a* and 180*b* may be disposed between the dielectric windows 150*a* and 150*b* to support the dielectric windows 150*a* and 150*b*.

The metal frame 170 may be disposed on a first plane at which the metal windows 180*a* and 180*b* and the dielectric windows 150*a* and 150*b* are disposed. Here, the metal frame 170 may be formed of one or more conductive materials, such as Al, copper (Cu), nickel (Ni), gold (Au), silver (Ag), or a combination thereof. In some embodiments, the metal frame 170 may be formed of Al and may be coated with $Y_2O_3$. Assuming that the metal frame 170 is formed of Al and coated with $Y_2O_3$, the plasma resistance of the inductively coupled plasma processing apparatus 100 may be such that the useful life of the inductively coupled plasma processing apparatus 100 is extended. The metal frame 170 may be disposed on the first plane (defined in the X and Y directions) at a fourth vertical location z4 (defined in the Z direction) within the chamber 110.

The space provided by the chamber 110 may be laterally distinguished into a centrally-located first zone (Zone 1) and a peripherally-located second zone (Zone 2) at least partially surrounding the first zone. In some embodiments, the first zone will not include the gas inlet pipes 120, the metal windows 180*a* and 180*b*, the dielectric windows 150*a* and 150*b* or the high-frequency antennas 160*a* and 160*b*. Instead, a number of centrally-located nozzles 122*a* (among a plurality of nozzles 122) may be disposed in the first zone. For example, the nozzles 122*a* may to receive gas(es) from the gas injector 130 and extend downward through the metal frame 170 in order to apply (or spray) the gas(es) into the lower chamber 110*b*.

Figure 3:
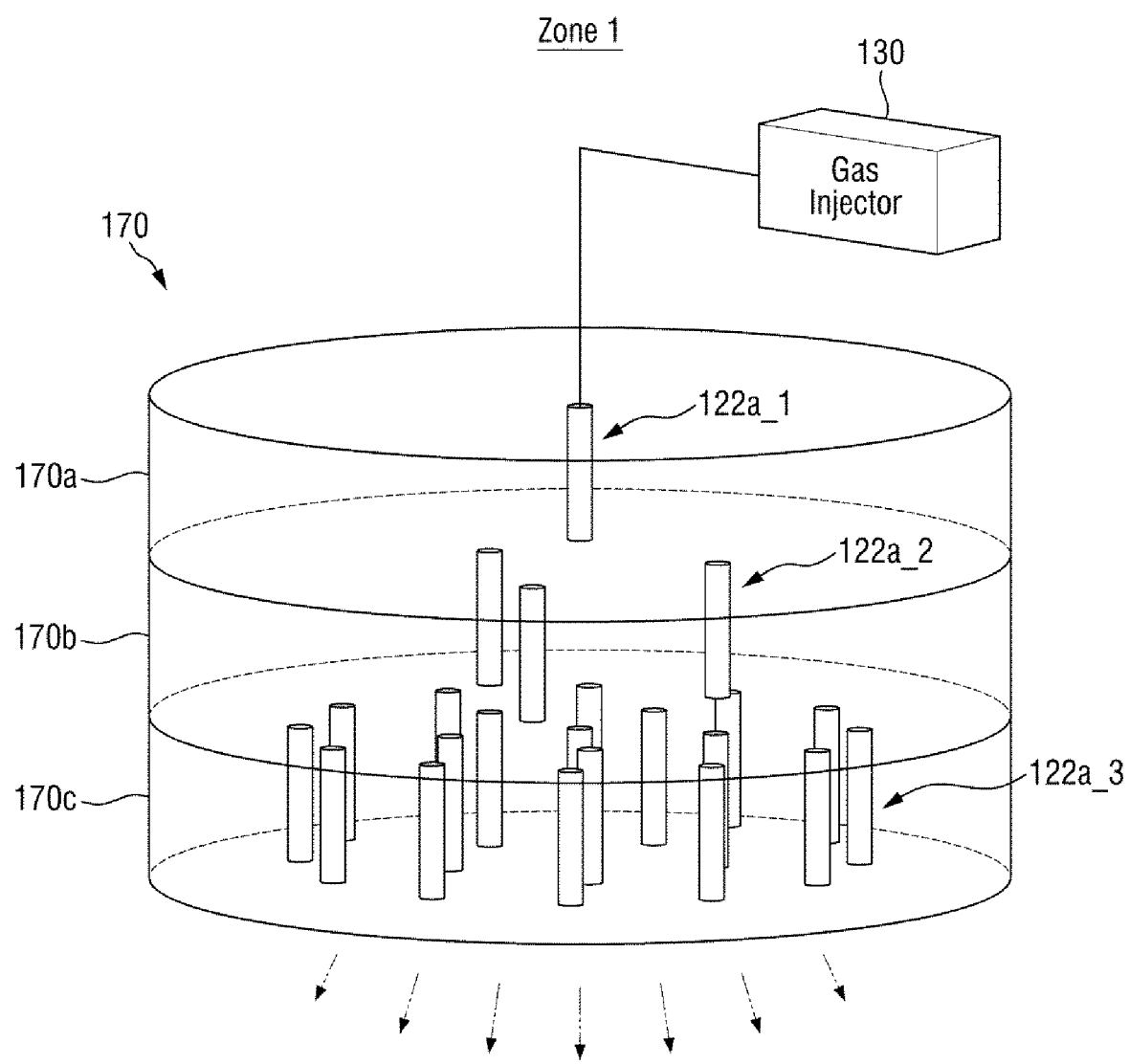
FIG. 3 illustrates the first zone "Zone 1" of the inductively coupled plasma processing apparatus of FIG. 1.

FIG. 3 is a conceptual diagram further illustrating in one example the application of gas(es) in the first zone of the inductively coupled plasma processing apparatus of FIG. 1. Those skilled in the art will recognize that the embodiment described in relation to FIG. 3 is merely exemplary in nature.

Referring to FIG. 3, the nozzles 122 may be variously connected to and through the metal frame 170. In the illustrated example of FIG. 3, the metal frame 170 is assumed to have a cylindrical shape and include three (3) layers (e.g., a first layer 170*a*, a second layer 170*b* and a third layer 170*c*), wherein an arrangement of the centrally-located nozzles 122*a* may include first nozzles 122*a*_1 disposed through the first layer 170*a*, second nozzles 122*a*_2 disposed through the second layer 170*b*, and third nozzles 122*a*_3 disposed through the third layer 170*c*.

With this configuration, the first nozzles 122*a*_1 may be connected to the first layer 170*a*, receive gas(es) from the gas injector 130, and deliver the gas(es) to the second layer 170*b* of the metal frame 170. The second layer 170*b* of the metal frame 170 may receive the gas(es) from the first layer 170*a* of the metal frame 170 and deliver the gas(es) to the third layer 170*c* of the metal frame 170 through the second nozzles 122*a*_2. And the third layer 170*c* of the metal frame 170 may receive the gas(es) from the second layer 170*b* of the metal frame 170 and apply the gas(es) into the lower chamber 110*b* through the third nozzles 122*a*_3. That is, the third nozzles 122*a*_3 may spray the gas(es) received from the gas injector 130 into the lower chamber 110*b* like a shower head.

Referring to FIG. 2, the metal windows 180*a* and 180*b*, the dielectric windows 150*a* and 150*b* and the high-frequency antennas 160*a* and 160*b* may be disposed in the second zone (Zone 2) surrounding the first zone (Zone 1) wherein the metal frame 170 is disposed.

As noted above, the dielectric windows 150*a* and 150*b* may be formed of one or more insulating material(s), such that an induced electric field generated by the high-frequency antennas 160*a* and 160*b* may be effectively transmitted to the lower chamber 110*b*. In this manner, the dielectric windows 150*a* and 150*b* may reduce capacitive coupling between the high-frequency antennas 160*a* and 160*b*, thereby further enabling the generation of plasma by the electric field generated by the high-frequency antennas 160*a* and 160*b*. Further, if the dielectric windows 150*a* and 150*b* may be formed of 99.9% $Al_2O_3$ and the efficiency of transmitting the energy generated by the high-frequency antennas 160*a* and 160*b* may be improved.

Here, the electric field is generated downwardly (in the Z direction) from the high-frequency antennas 160*a* and 160*b*, and may additionally be laterally induced (in the X and Y directions) within the lower chamber 110*b* according to a time-varying electric field. Electrons accelerated by the induced electric field collide with a neutral gas, thereby generating ions and radicals. The substrate S, which is fixed within the lower chamber 110*b*, may be processed by impacts from the ions and the radicals.

In this regard, a substrate support 140 may be provided in a lower portion of the lower chamber 110*b* in order to fix the substrate S. The substrate support 140 may be formed of one or more conductive material(s) such as, (e.g.,) Al having its inner wall surface anodized. The substrate support 140 may be vertically lifted by a driving device (not shown). The substrate support 140 may be connected to a matching device 142 and a high-frequency power source 144.

As a result, incident energy associated with the ions in the plasma generated in the lower chamber 110*b* may be directed towards the substrate S by adjusting the high frequency power as a bias during plasma processing using the high-frequency power source 144.

Gas inlet pipes 120*a* and 120*b* may be disposed within the metal windows 180*a*, and 180*b*, respectively. The gas inlet pipes 120*a* and 120*b* may deliver gas(es) supplied from the gas injector 130. The gas inlet pipes 120*a* and 120*b* may extend from the outside to the inside of the chamber 110. Here, the gas inlet pipes 120*a* and 120*b* are not disposed in the metal frame 170, but disposed only in the metal windows 180*a* and 180*b* of the second region.

The gas inlet pipes 120*a* and 120*b* may be connected to laterally-located nozzles 122*b* and 122*c*, respectively. The laterally-located nozzles 122*b* and 122*c* may be connected to the gas inlet pipe 120*a* and may be used to evenly spray gas(es) downwardly (in the Z direction) from the first plane to the lower chamber 110*b*. The laterally-located gas inlet pipes 120*a* and 120*b* may be disposed in the second zone.

Figure 4:
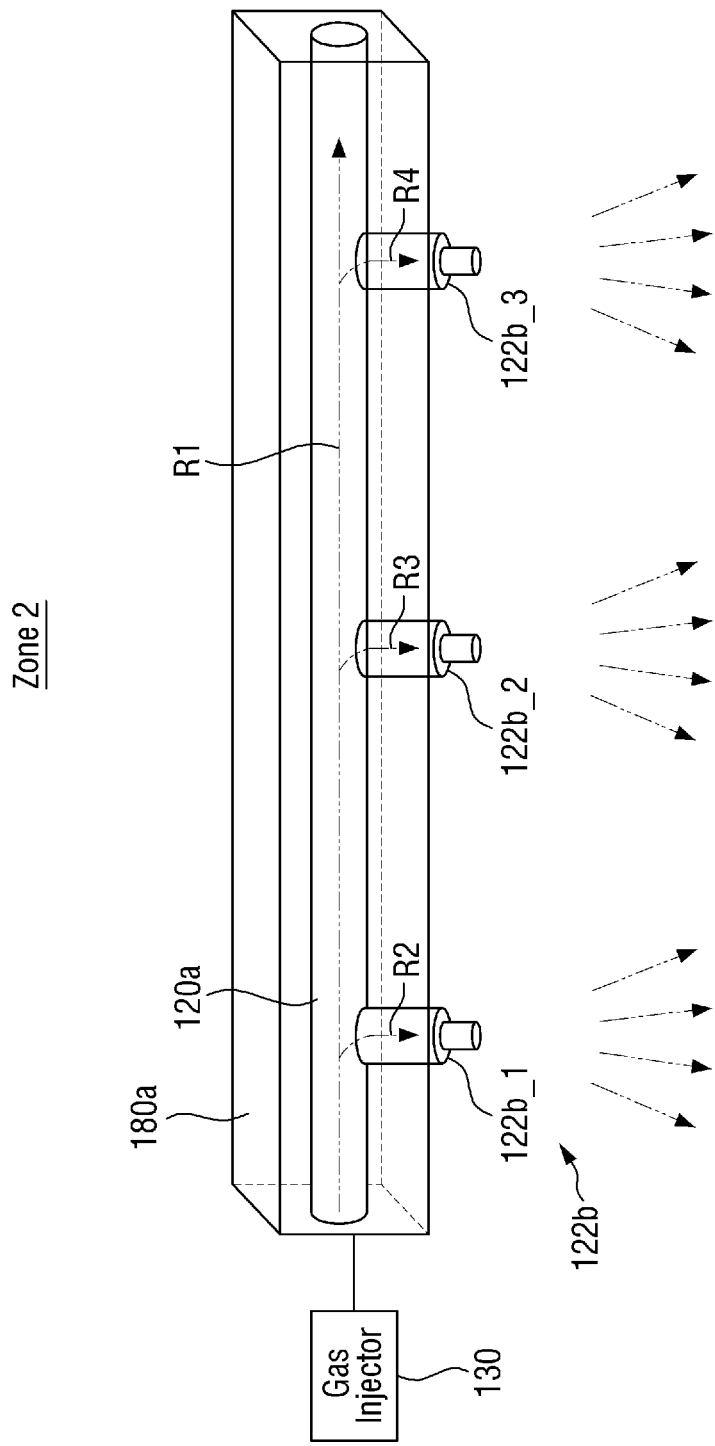
FIG. 4 illustrates the second zone "Zone 2" of the inductively coupled plasma processing apparatus of FIG. 1.

FIG. 4 is a conceptual diagram further illustrating in one example an arrangement of laterally-located nozzles 122b in the second zone (Zone 2) of the inductively coupled plasma processing apparatus of FIG. 1.

Referring to FIGS. 1, 2 and 4, the gas inlet pipe 120a may be disposed in the metal window 180a which is disposed in the second zone (Zone 2) surrounding the first zone (Zone 1).

In this regard, the gas inlet pipe 120a may extend from the outside of the second zone towards the first zone.

A number of laterally-located nozzles (e.g., 122b_1, 122b_2, and 122b_3) may be connected to the gas inlet pipe 120a. Thus, the gas inlet pipe 120a may receive gas(es) from the gas injector 130, transfer the gas(es) along a first path R1, and then selectively re-direct the flow of gas(es) into the lower chamber 110b through one or more of the laterally-located nozzles 122b_1, 122b_2 and 122b_3 along one or more of a second path R2, a third path R3 and a fourth path R4.

The illustrated example of FIG. 4 may be applied to one or more of the metal windows 180 and a corresponding gas inlet pipe 120 may similarly associated with each of the metal windows 180. However, the number, location, shape and arrangement of laterally-located nozzles in relation to one or more gas inlet pipe(s) is a matter of particular design.

The gas inlet pipes 120a may be evenly distributed on the first plane separating the upper chamber 110a from the lower chamber 110b, and laterally-located nozzles respectively connected to the gas inlet pipes 120a may be evenly distributed about second zone of the first plane. Thus, gas(es) may be sprayed through the nozzles in a manner to evenly distribute the gas(es) from the first plane towards the lower chamber 110b to improved overall uniformity of the plasma processing.

Figure 5:
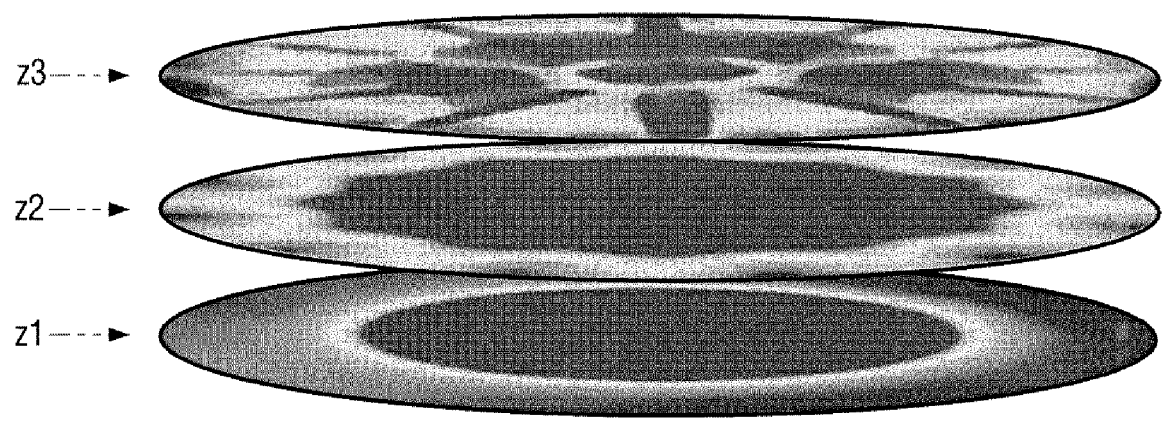
FIG. 5 illustrates the distribution of gases sprayed into a chamber by the inductively coupled plasma processing apparatus of FIG. 1.

FIG. 5 is a conceptual diagram further illustrating in one example the manner in which gas(es) applied (or introduced) to the chamber 110 of the inductively coupled plasma processing apparatus of FIG. 1 may be uniformly distributed.

Here, the distribution of gas(es) may be considered as the gas(es) descend (in the Z direction) downwardly through the lower chamber 110b as previously described in relation to FIGS. 2 and 4. In FIG. 5, darker variations in the several images indicate a denser concentration of the gas(es).

Referring to FIG. 5, and as previously noted in the description of FIG. 2, the gas(es) are introduced at the fourth vertical location z4 associated with the first plane separating the upper chamber 110a from the lower chamber 110b. Once introduced via centrally-located and laterally located nozzles 122a, 122b and 122c, the gas(es) sequentially descend to a third vertical location Z3, to a second vertical location Z2 and to a first vertical location z1 proximate the substrate fixed to the support 140. Of particular note, as the gas(es) descend downwardly through the lower chamber 110b the uniformity of the gas distribution improves markedly.

In this manner, the distribution of gas(es) sprayed into the inductively coupled plasma processing apparatus 100 may maintain a high uniformity within the lower chamber 110b. Accordingly, the reliability of plasma process(es) performed by the inductively coupled plasma processing apparatus 100 may be improved.

As described in relation to FIG. 1, the metal windows 180 may be disposed between the dielectric windows 150 to separate the dielectric windows 150 from one another. That is, when the area occupied by the dielectric windows 150 when the first plane in the lower chamber 110b consists of only the dielectric windows 150 is 100, the area occupied by the dielectric windows 150 may be reduced below 100 by spacing apart the dielectric windows 150.

Accordingly, as the proportion (or percentage) of the first plane occupied by the dielectric windows 150 is reduced, the first thickness T1 of the dielectric windows 150 may also be reduced. To support the dielectric windows 150 with a reduced first thickness T1, the metal windows 180 may be disposed between the dielectric windows 150. That is, by reducing the first thickness T1 of the dielectric windows 150, the density of plasma may be improved (in relation to a constant power level) within the inductively coupled plasma processing apparatus 100. Of further note, despite the fact that the durability of the inductively coupled plasma processing apparatus 100 may be reduced due to relatively thinner dielectric windows 150, since the metal windows 180 are arranged between the dielectric windows 150, the overall durability of the inductively coupled plasma processing apparatus 100 may be improved.

The metal windows 180 may be formed of one or more conductive materials, such as Al, Cu, Ni, Au, Ag, or a combination thereof, but the inventive concept is not limited thereto. For example, the metal windows 180 may be formed of Al and coated with $Y_2O_3$. As the metal windows 180 are formed of Al and coated with $Y_2O_3$, the plasma resistance of the inductively coupled plasma processing apparatus 100 may be such that the useful life of the inductively coupled plasma processing apparatus 100 is extended.

As noted above, the gas inlet pipes 120 may be respectively disposed in the metal windows 180. That is, the gas inlet pipes 120 may extend from the outside to the inside of the first plane and provide various pathways through which gas(es) may be introduced (e.g., sprayed) into the chamber 110b. In this regard, each gas inlet pipe 120 may be connected to one or more laterally-located nozzles (e.g., the nozzles 122b or nozzles 122c), such that gas(es) transferred along the gas inlet pipes 120 may be sprayed into the chamber 110b through the nozzles 122b or the nozzles 122c.

The operating characteristics of the inductively coupled plasma processing apparatus 100 may vary in accordance with an area ratio between the dielectric windows 150 and the metal windows 180 included in the first plane.

Figure 6:
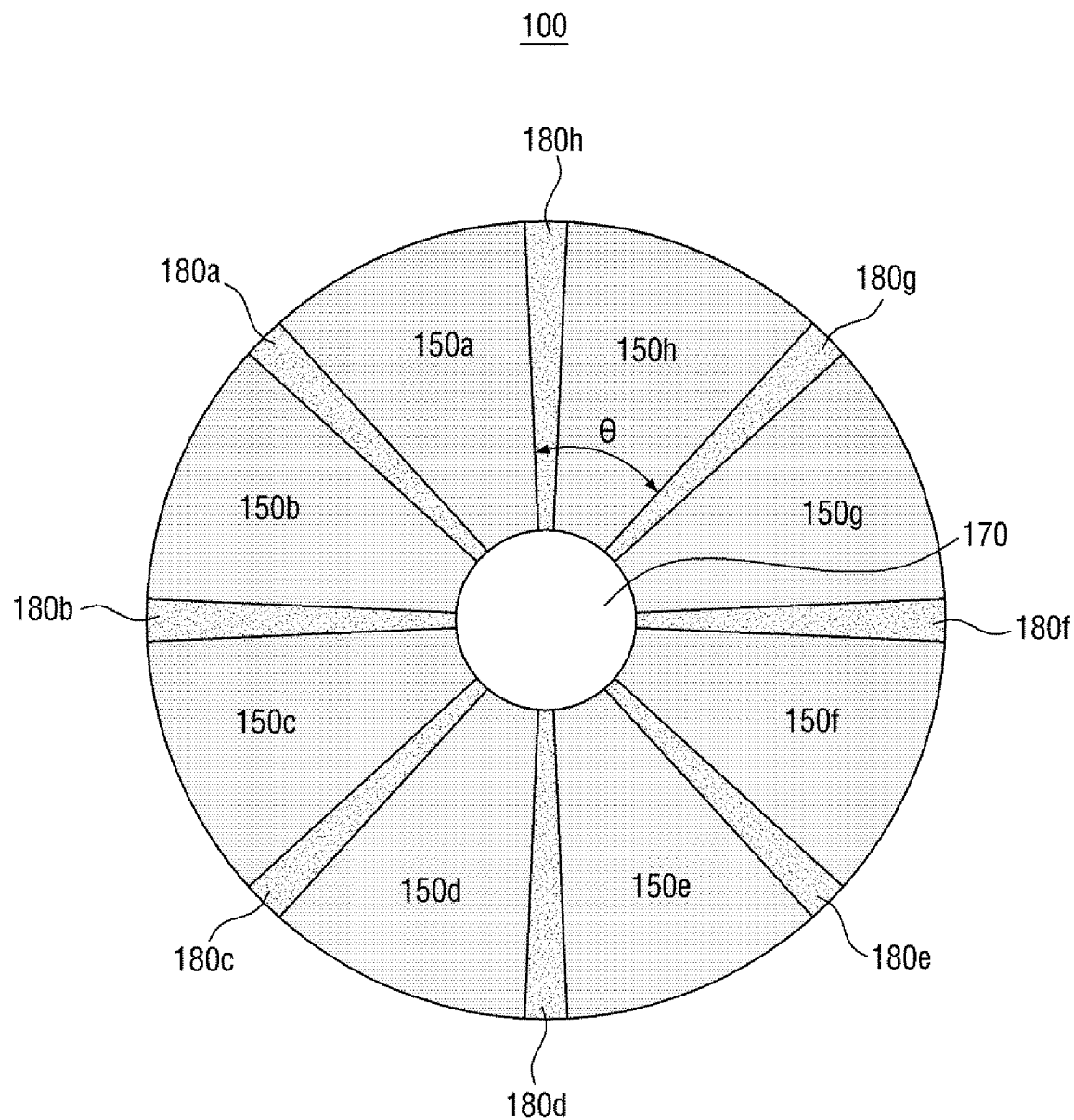
FIG. 6 is a cross-sectional view of the inductively coupled plasma processing apparatus of FIG. 1, as viewed from above (i.e., in the third direction z)

FIG. 6 is a plan (or top-down) view of the first plane disposed at the fourth vertical location and separating the upper chamber 110a from the lower chamber 110b in the inductively coupled plasma processing apparatus of FIG. 1. The first plane includes a number of metal windows 180a through 180h alternatingly disposed between the dielectric windows 150a through 150h.

In the illustrated example of FIG. 6, a first size of each metal window 180 is the same, and a second size of each dielectric window 150 is the same, but his need not always be the case. Further, the first size is less than the second size. In this regard, the operating characteristics of the inductively coupled plasma processing apparatus 100 will vary in accordance with the ratio between an area occupied by the dielectric windows 150a through 150h and an area occupied by the metal windows 180a through 180h.

In the illustrated example of FIG. 6, the area occupied by the dielectric windows 150a through 150h may be greater than the area occupied by the metal windows 180a through 180h. For example, in some embodiments, the area occupied by the dielectric windows 150a through 150h may be three times (3X) greater than the area occupied by the metal windows 180a through 180h, thereby maximizing the density of electrons generated in the lower chamber 110b.

As the area occupied by the dielectric windows 150a through 150h changes, an angle θ between the dielectric windows 150a through 150h may also vary. For example, in a case where the area occupied by the dielectric windows 150a through 150h is three times greater than the area occupied by the metal windows 180a through 180h and the angle θ between the dielectric windows 150a through 150h is 15°, the density of electrons generated in the lower chamber 110b may be maximized.

Figure 7:
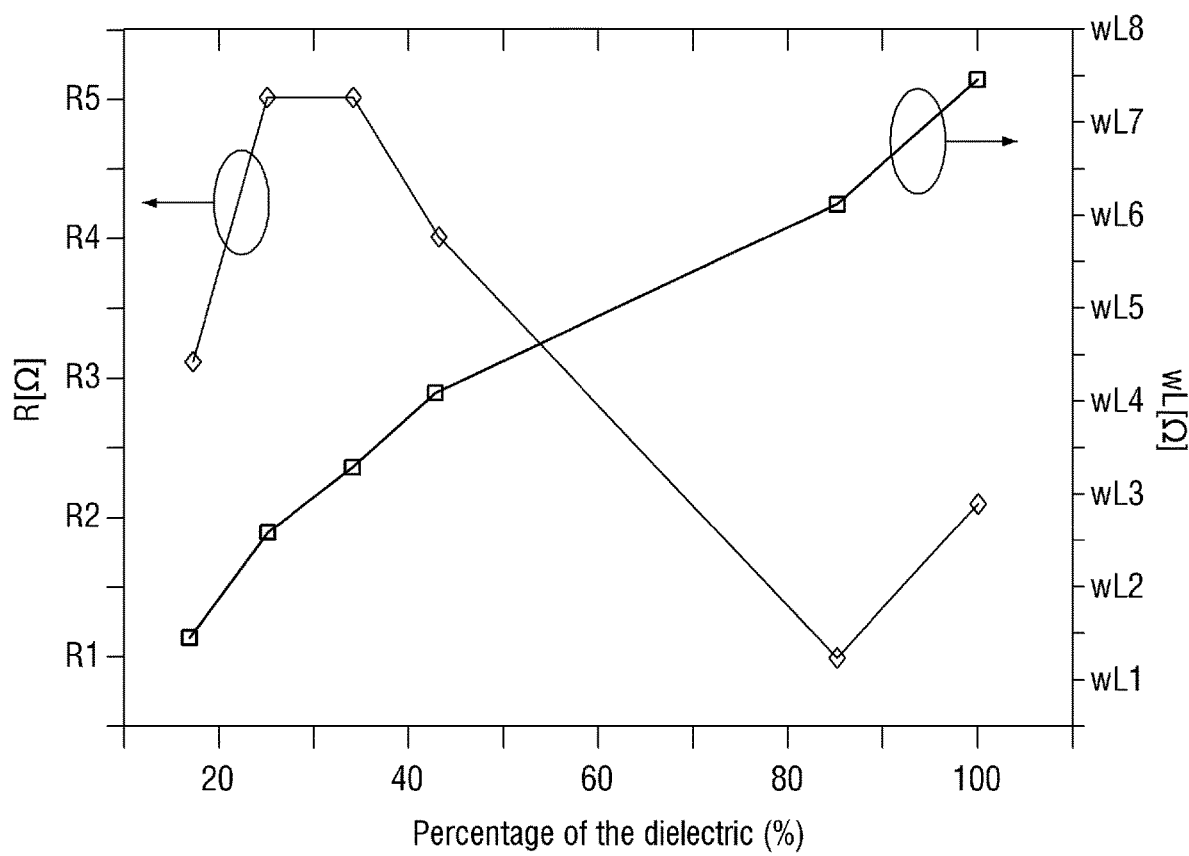
FIG. 7 is a graph showing the variation of the system impedance of the inductively coupled plasma processing apparatus of FIG. 1 with the area occupied by the dielectric windows of the inductively coupled plasma processing apparatus of FIG. 1.

FIG. 7 is a graph illustrating variation in the overall impedance of a system including the inductively coupled plasma processing apparatus of FIG. 1 as a function of the area occupied by the dielectric windows included in the first plane of the inductively coupled plasma processing apparatus of FIG. 1.

In FIG. 7, the left side Y axis shows variation in the resistance, the right side Y axis shows variation in the induced resistance of the system including the inductively coupled plasma processing apparatus 100 as a function of the percentage of the first plane occupied by the dielectric windows 150 (the X axis).

Referring to FIG. 7, the resistance of the system including the inductively coupled plasma processing apparatus 100 is R3, R5, and R2 (see the left Y axis) when the percentage of the first plane occupied by the dielectric windows 150 is 20%, 30%, and 100%, respectively (see the X axis).

Also, referring to FIG. 7, the induced resistance of the system including the inductively coupled plasma processing apparatus 100 may be in the range of wL7 and wL8 (see the right Y axis) when the percentage of the first plane occupied by the dielectric windows 150 is 100% (see the X axis).

Accordingly, the percentage of the first plane occupied by the dielectric windows 150 may be determined based on any desired resistance and/or any desired induced resistance of the system including the inductively coupled plasma processing apparatus 100.

Figure 8:
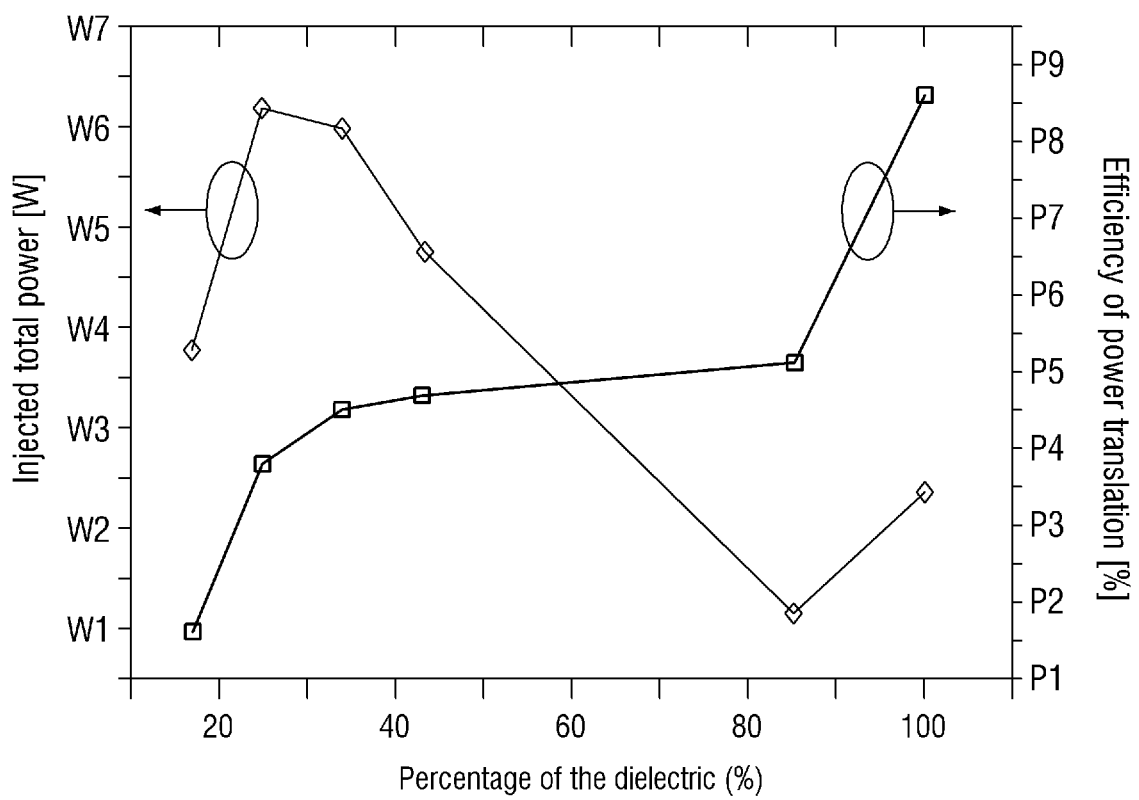
FIG. 8 is a graph showing the variation of the efficiency of the system including the inductively coupled plasma processing apparatus of FIG. 1 with the area occupied by the dielectric windows of the inductively coupled plasma processing apparatus of FIG. 1.

FIG. 8 is a graph illustrating variation in the efficiency of a system including the inductively coupled plasma processing apparatus of FIG. 1 as a function of the area occupied by the dielectric windows in the first plane of the inductively coupled plasma processing apparatus of FIG. 1.

In FIG. 8, the left Y axis shows variation in the total injected power, and the right Y axis shows translation efficiency for the system including the inductively coupled plasma processing apparatus 100 as a function of the percentage of the first plane occupied by the dielectric windows 150 (the x axis).

Referring to FIG. 8, power required by the system including the inductively coupled plasma processing apparatus 100 is between W3 and W4 and between W2 and W4 (see the left Y axis) when the percentage of the first plane occupied by the dielectric windows 150 is 20% and 100%, respectively (see the X axis).

Also, referring to FIG. 8, the power translation efficiency of the system including the inductively coupled plasma processing apparatus 100 is between P8 and P9 (see the right Y axis) when the percentage of the first plane occupied by the dielectric windows 150 is 100% (see the X axis). Here, the term "power translation efficiency" means the ratio of power provided to plasma to injected power for driving the inductively coupled plasma processing apparatus 100.

Accordingly, the percentage of the first plane occupied by the dielectric windows 150 may be determined based on the total injected power or the power translation efficiency of the system including the inductively coupled plasma processing apparatus 100.

Figure 9:
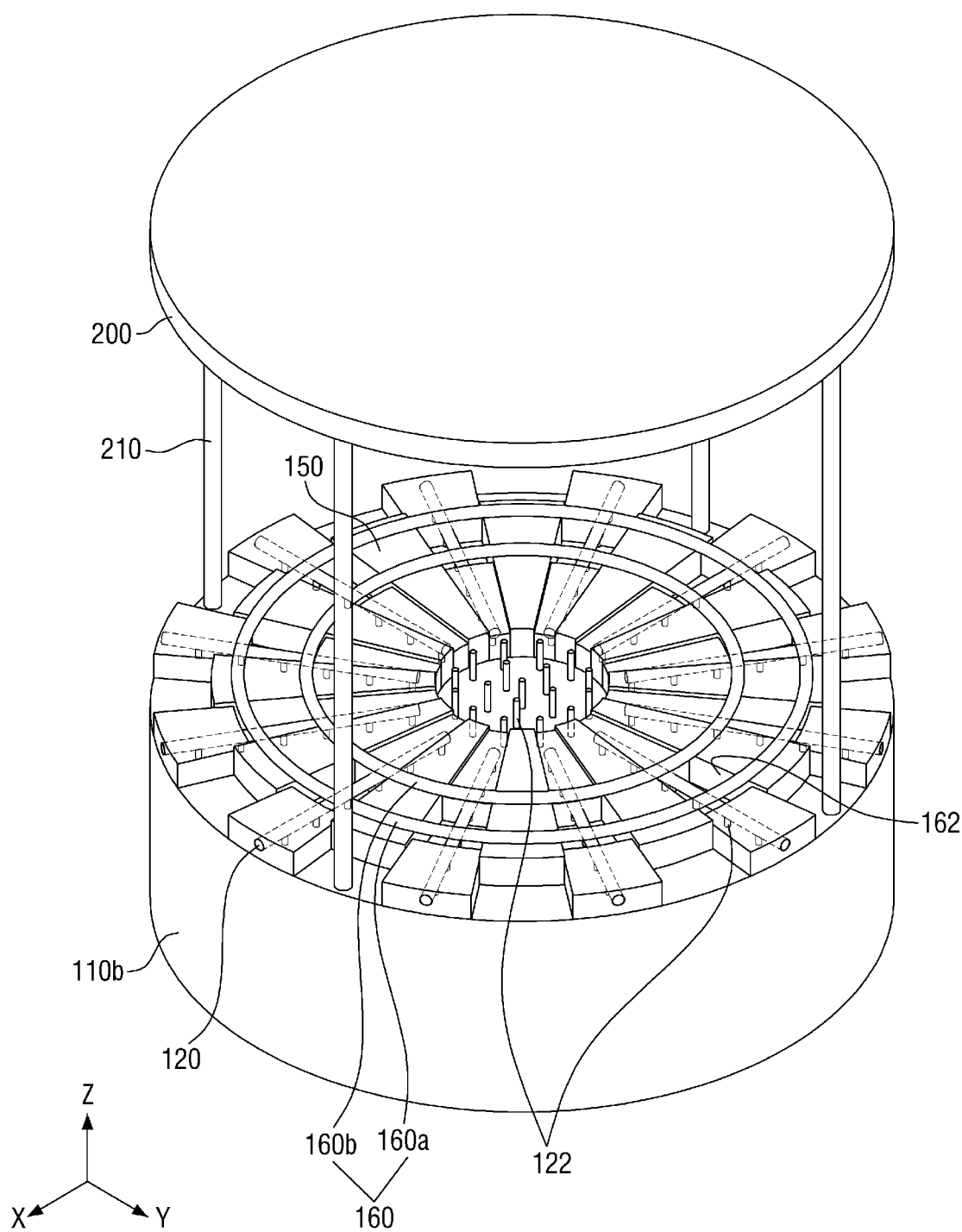
FIG. 9 illustrates an inductively coupled plasma processing apparatus according to some embodiments of the present disclosure.
Figure 10:
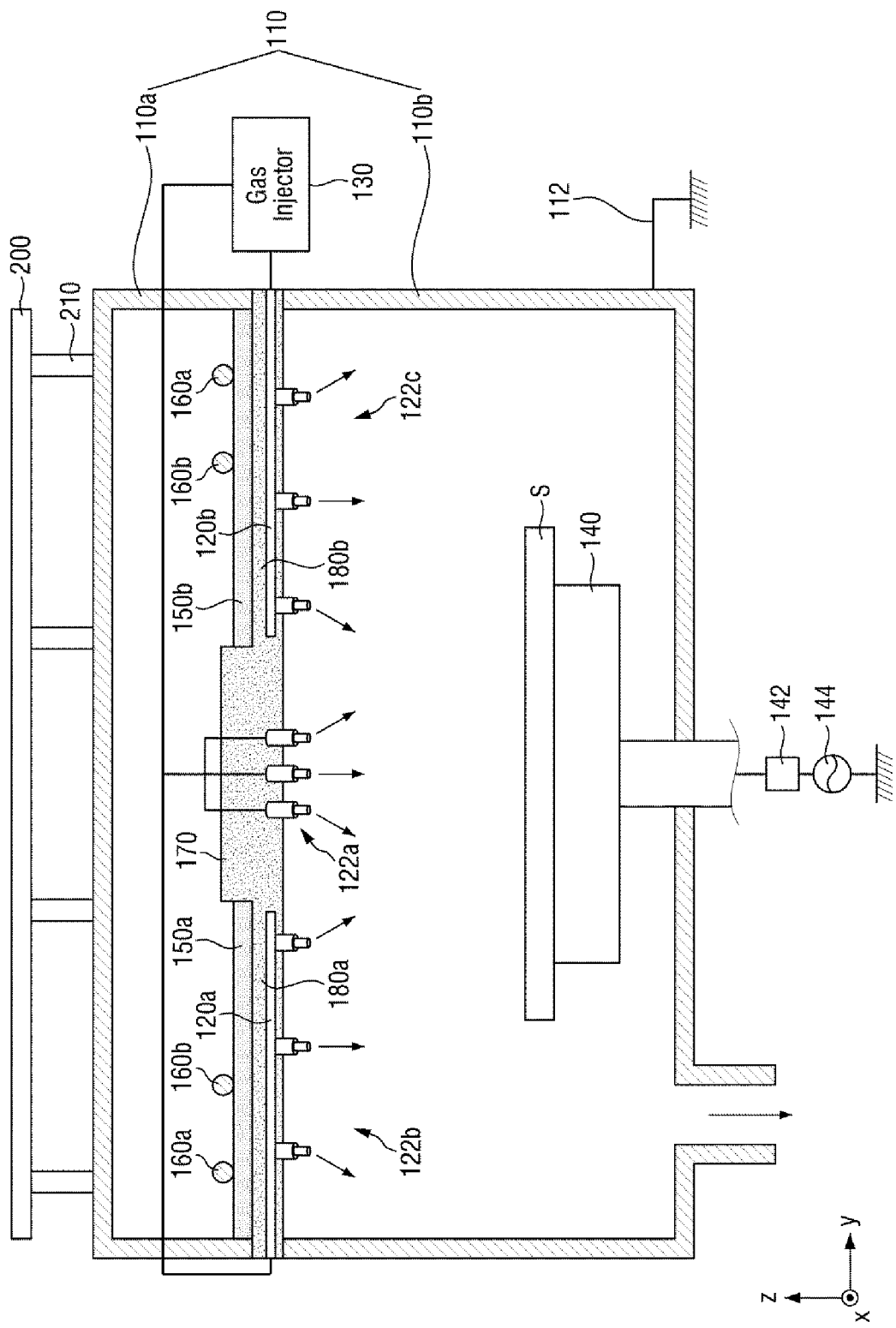
FIG. 10 is a cross-sectional view of the inductively coupled plasma processing apparatus of FIG. 9, as viewed from one direction (or a first direction x)

FIG. 9 is a perspective view of an inductively coupled plasma processing apparatus according to embodiments of the inventive concept, and FIG. 10 is a cross-sectional view (in the X direction) of the inductively coupled plasma processing apparatus of FIG. 9.

Referring to FIGS. 9 and 10, an inductively coupled plasma processing apparatus 100-2—in contrast to the inductively coupled plasma processing apparatus 100 of FIGS. 1 and 2—may further include supporting frames 210 and an anti-deformation frame 200.

Here, the anti-deformation frame 200 may be formed of a material having excellent durability against external shock and may be supported by the supporting frames 210.

The supporting frames 210 may be connected to a lower chamber 110b of the chamber 110 to connect the lower chamber 110b and the anti-deformation frame 200. The supporting frames 210 may be formed of a material with excellent durability against external shock.

Thus, even if external shock is applied to the chamber 110 during plasma processing, the chamber 110, the metal windows 180 and/or the dielectric windows 150 may be protected from deformation. In addition, the chamber 110, the metal windows 180 and/or the dielectric windows 150 will not be deformed due to factors arising from the performing of plasma processing.

Figure 11:
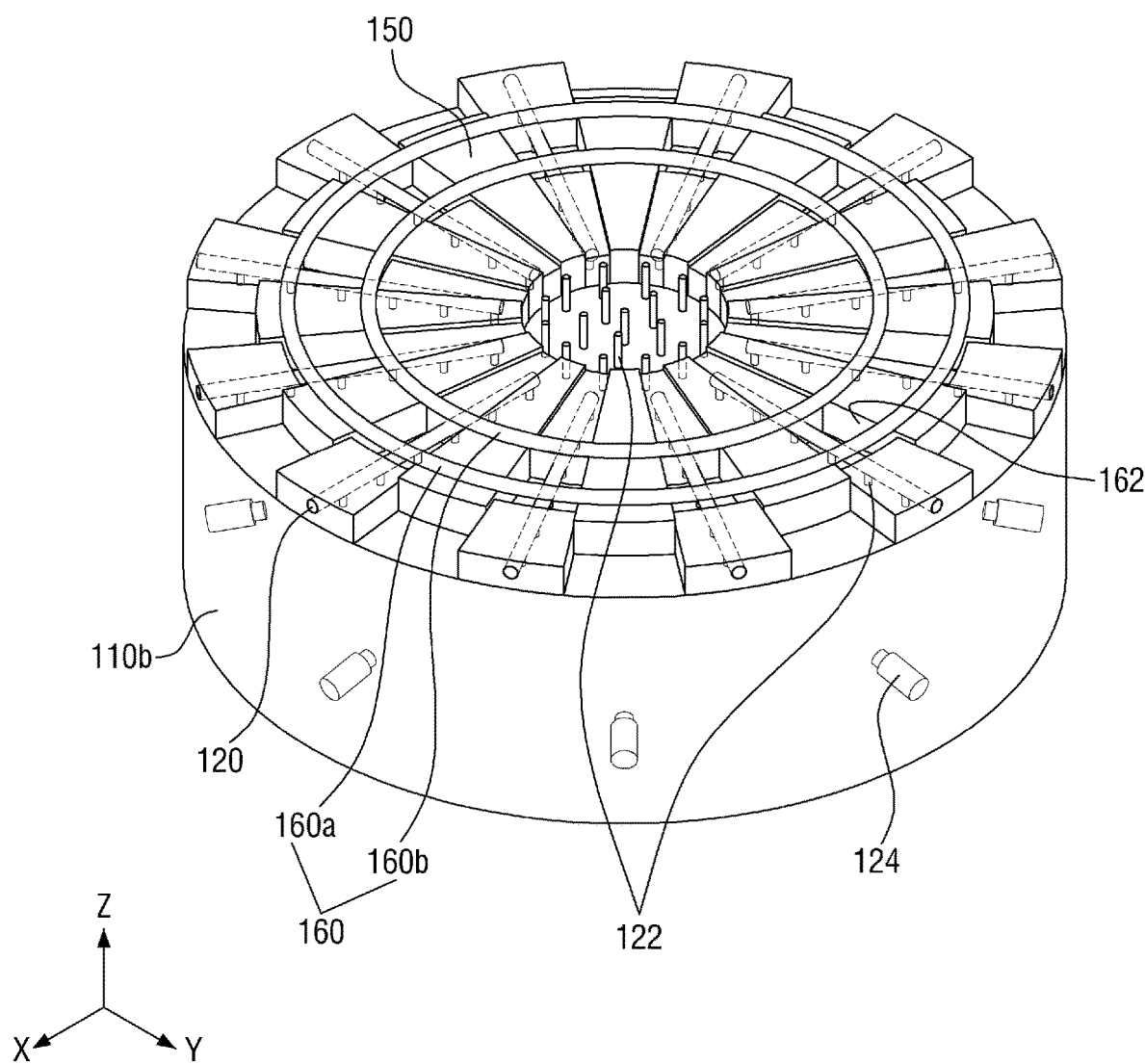
FIG. 11 illustrates an inductively coupled plasma processing apparatus according to some embodiments of the present disclosure.
Figure 12:
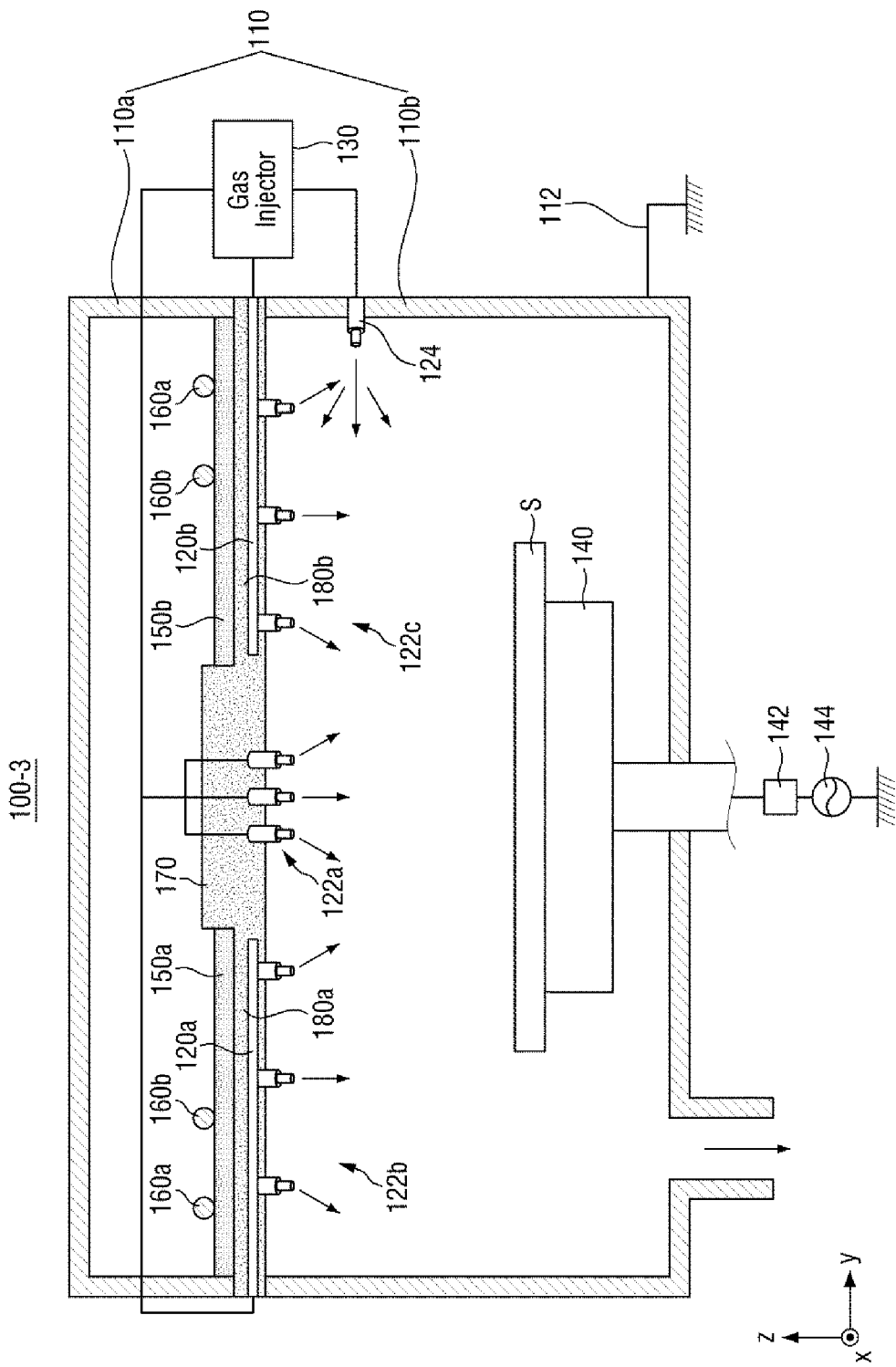
FIG. 12 is a cross-sectional view of the inductively coupled plasma processing apparatus of FIG. 11, as viewed from one direction (or a first direction x)

FIG. 11 is a perspective diagram further illustrating an inductively coupled plasma processing apparatus according to embodiments of the inventive concept, and FIG. 12 is a cross-sectional view (in the X direction) of the inductively coupled plasma processing apparatus of FIG. 11.

Referring to FIGS. 11 and 12, an inductively coupled plasma processing apparatus 100-3 may further include side gas inlet pipes 124 disposed on sidewalls of the lower chamber 110b. That is, the side gas inlet pipes 124 may be installed on the sidewall of a lower chamber 110b of the chamber 110 in order to receive gas(es) from the gas injector 130 and spray the gas(es) into the lower chamber 110b.

With the configuration of FIGS. 11 and 12, gases need not be sprayed from above the lower chamber 110b, but instead, the gas(es) may be introduced from the sidewall of the lower chamber 110b via the side gas inlet pipes 124 and the overall amount (or quantity) of gas(es) introduced into the lower chamber 110b may be increased.

Figure 13:
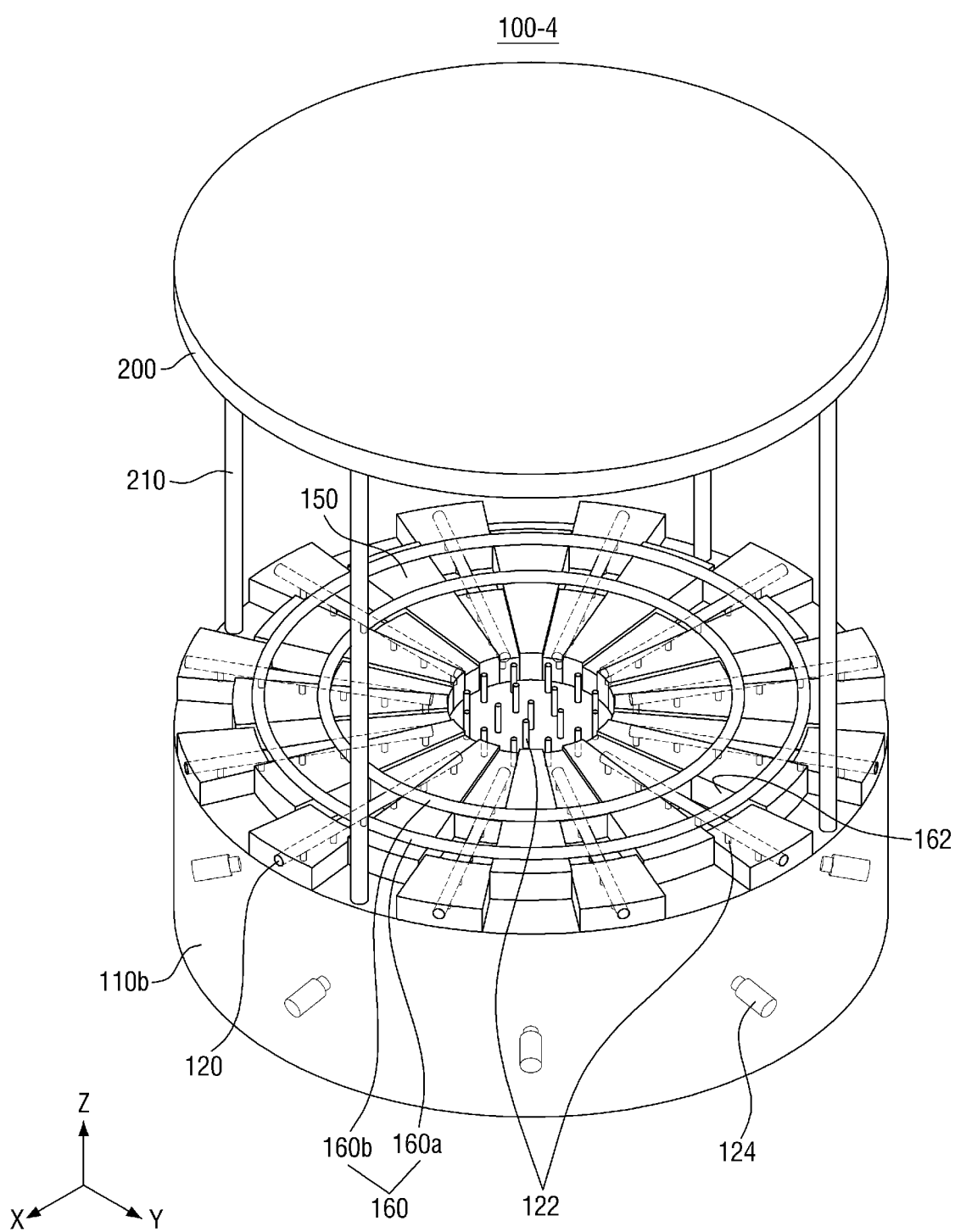
FIG. 13 illustrates an inductively coupled plasma processing apparatus according to some embodiments of the present disclosure.
Figure 14:
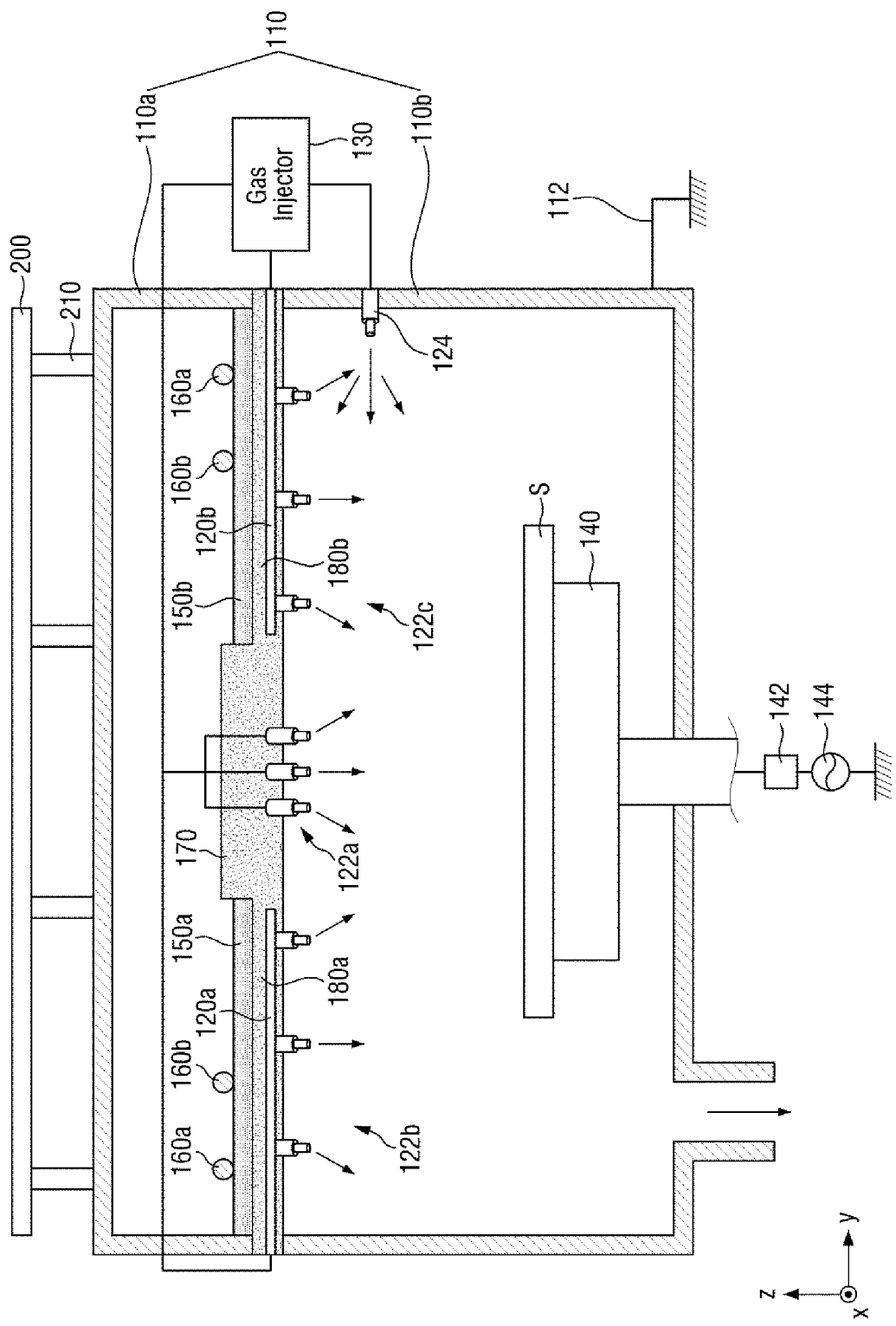
FIG. 14 is a cross-sectional view of the inductively coupled plasma processing apparatus of FIG. 13, as viewed from one direction (or a first direction x)

FIG. 13 is a perspective view of an inductively coupled plasma processing apparatus according to embodiments of the inventive concept, and FIG. 14 is a cross-sectional view (in the X direction) of the inductively coupled plasma processing apparatus of FIG. 13.

Referring to FIGS. 13 and 14, an inductively coupled plasma processing apparatus 100-4—in contrast to the inductively coupled plasma processing apparatus 100 of FIGS. 1 and 2—may further include supporting frames 210, an anti-deformation frame 200, and side gas inlet pipes 124 disposed on sidewalls of the lower chamber 110b. Here, the supporting frames 210 and the anti-deformation frame 200 may be the same as those described in relation to FIGS. 9 and 10, and the side gas inlet pipes 124 may be the same as that described in relation to FIGS. 11 and 12.

Figure 15:
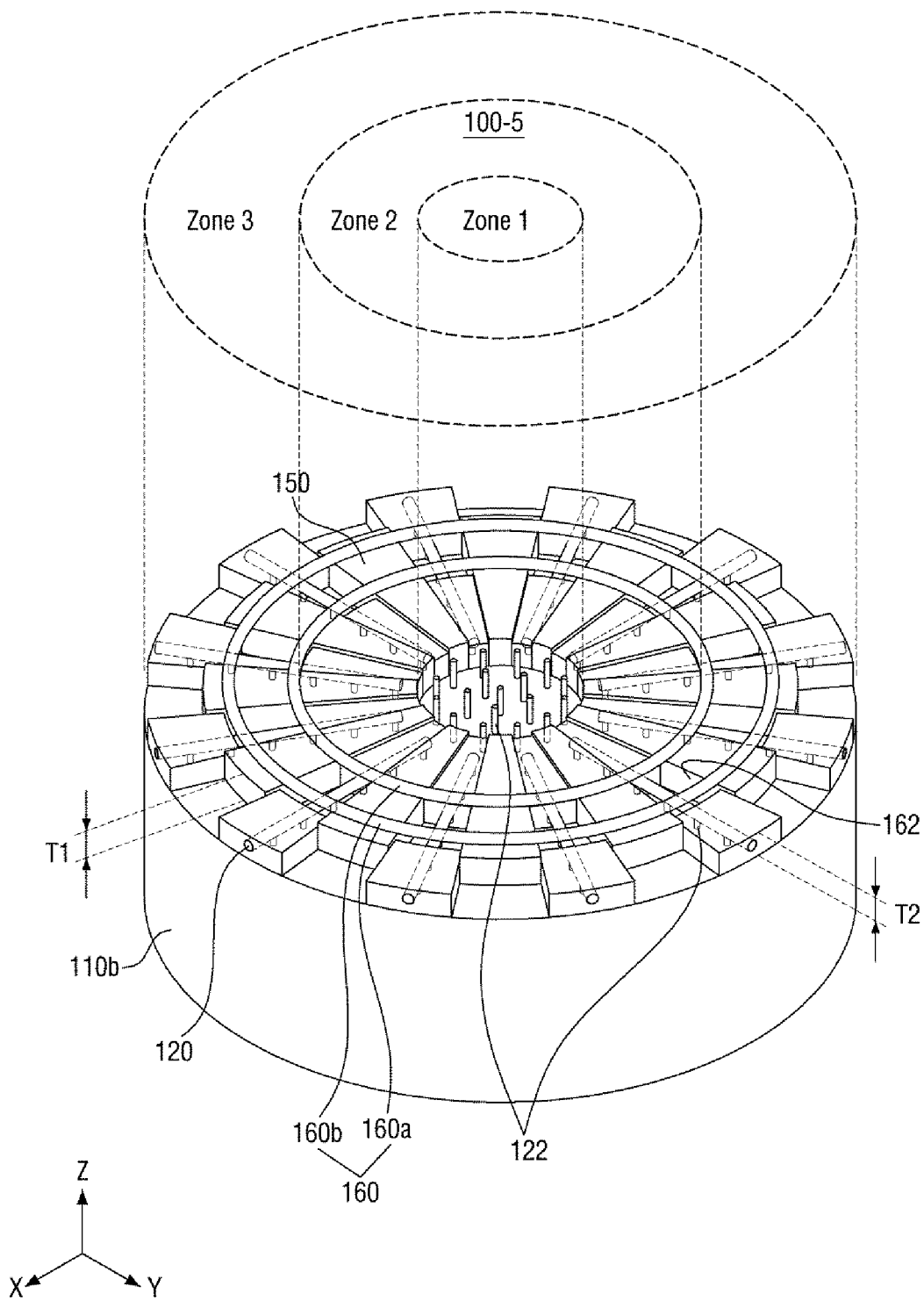
FIG. 15 illustrates an inductively coupled plasma processing apparatus according to some embodiments of the present disclosure.
Figure 16:
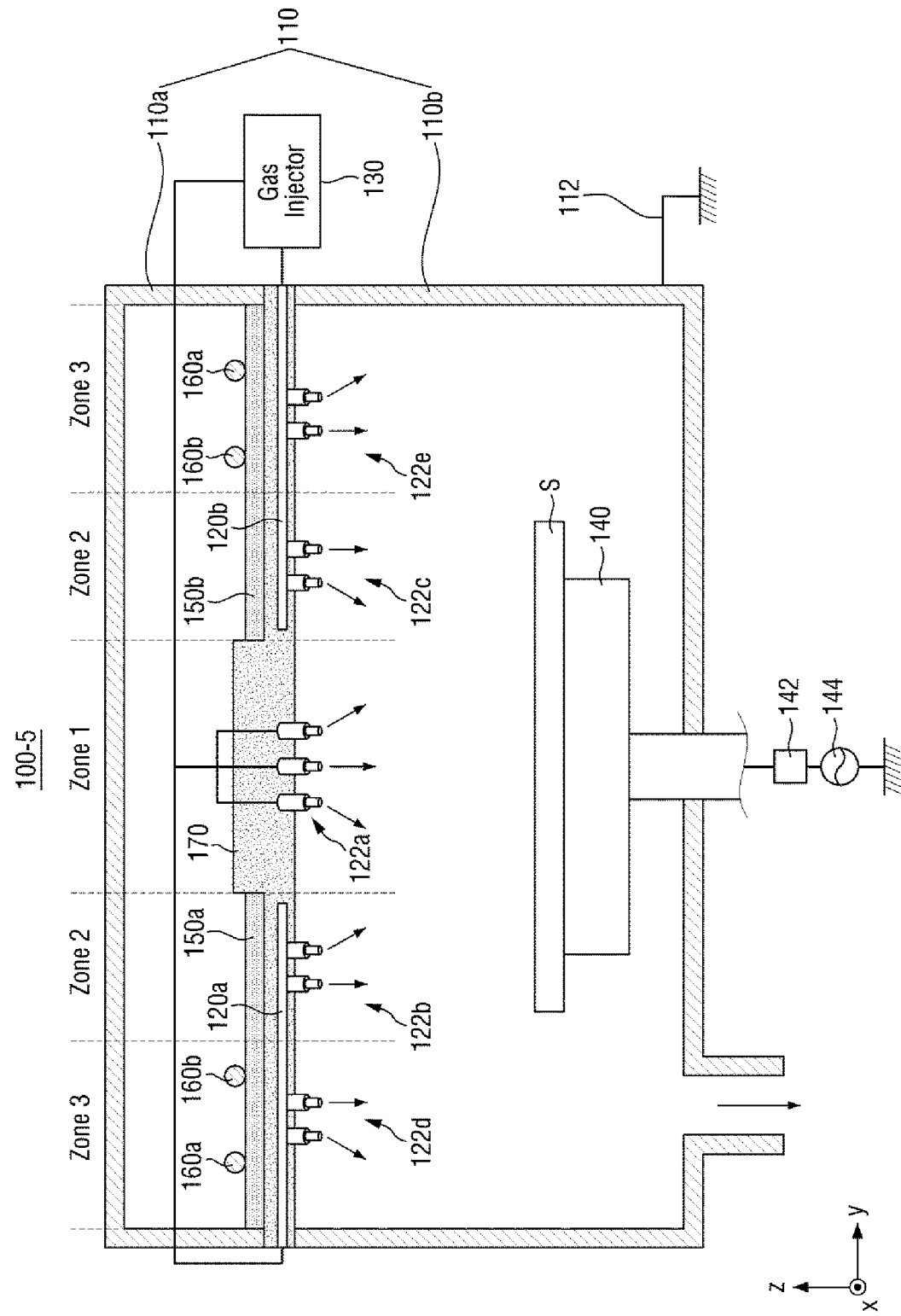
FIG. 16 is a cross-sectional view of the inductively coupled plasma processing apparatus of FIG. 15, as viewed from one direction (or a first direction x)
Figure 17:
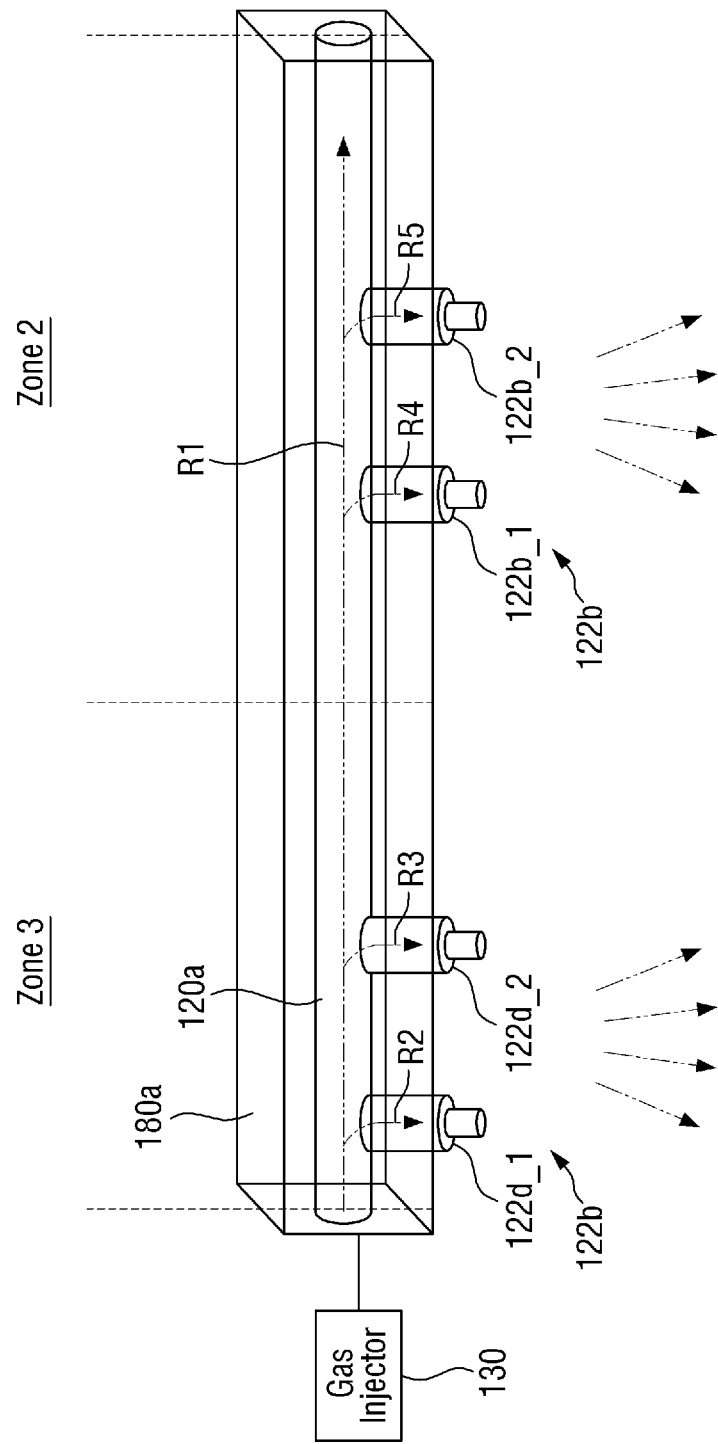
FIG. 17 illustrates the second and third zones "Zone 2" and "Zone 3" of FIG. 15.

FIG. 15 is a perspective view of an inductively coupled plasma processing apparatus according to embodiments of the inventive concept, FIG. 16 is a cross-sectional view (in the X direction) of the inductively coupled plasma processing apparatus of FIG. 15, and FIG. 17 further illustrates in one example an arrangement of laterall0disposed nozzles and a gas inlet pipe 120.

Referring to FIGS. 15 and 16, the plasma processing space provided by the inductively coupled plasma processing apparatus 100-5—in contrast to the inductively coupled plasma processing apparatus 100 of FIGS. 1 and 2—may be divided (e.g., in relation to the first plane separating the upper chamber 110a from the lower chamber 110b) into the first zone (Zone 1), the second zone (Zone 2) and an additional third zone (Zone 3). As before, the number and relative size of the various zones may be a matter of design choice.

In this regard, further groupings of laterally-located nozzles (e.g., 122d and 122e) may be variously connected to gas inlet pipes 120 extending along various zones in the inductively coupled plasma processing apparatus 100-5.

And as further illustrated in FIG. 17, a gas introduction (or spraying) operation performed by the inductively coupled plasma processing apparatus 100-5 can be sophisticatedly controlled to provide greater gas distribution accuracy. Although not specifically illustrated in FIGS. 15 and 16, side gas inlet pipes may be further installed on sidewalls of the lower chamber 110b of the inductively coupled plasma processing apparatus 100-5 and/or the inductively coupled plasma processing apparatus 100-5 may further include an anti-deformation frame.

FIG. 17 further illustrates the second zone and the third zone of the inductively coupled plasma processing apparatus 100-5 of FIG. 15.

Referring to FIGS. 16 and 17, the gas inlet pipe 120a may be disposed in a metal window 180a in the second and third zones surrounding the first zone. Here, the gas inlet pipe 120a may extend from the outside of the third zone to the first zone.

In the third zone, various laterally-located nozzles (e.g., 122d_1 and 122d_2) may be various connected to the gas inlet pipe 120a, receive gas(es) from the gas injector 130, and selectively provide the gas(es) into the chamber 110 via a first path R1, a second path R2, a third path R3, a fourth path R4 and a fifth path R5 using the nozzles 122b_1, 122b_2, 122d_1, and 122d_2.

As before, however, the number, location, arrangement and shape of the various nozzles deemed to be a design choice. Nonetheless, a careful design and layout of laterally-disposed nozzles may provide an even distribution of gas(es) throughout the lower chamber 110b.

Certain embodiments of the inventive concept have been described in the context of several drawings. However, these are merely examples and many changes, extensions an variations may be made to the illustrated embodiments without departing from the scope of the inventive concept as defined by the following claims.

What is claimed is:

1. An inductively coupled plasma processing apparatus, comprising:
   a lower chamber providing a space for a substrate;
   a high-frequency antenna configured to generate inductively coupled plasma in the lower chamber;
   a plurality of dielectric windows disposed between the lower chamber and the high-frequency antenna;
   metal windows alternatingly disposed between the plurality of dielectric windows to separate the plurality of dielectric windows from each other; and
   gas inlet pipes disposed in each of the metal windows, wherein each of the gas inlet pipes includes nozzles configured to introduce gases to the lower chamber.

2. The inductively coupled plasma processing apparatus of claim 1, wherein an area occupied by the plurality of dielectric windows is greater than an area occupied by the metal windows.

3. The inductively coupled plasma processing apparatus of claim 2, wherein the area occupied by the plurality of dielectric windows is three times greater than the area occupied by the metal windows.

4. The inductively coupled plasma processing apparatus of claim 1, wherein the metal windows include aluminum (Al).

5. The inductively coupled plasma processing apparatus of claim 4, wherein the metal windows include a $Y_2O_3$ coating.

6. The inductively coupled plasma processing apparatus of claim 1, wherein the plurality of dielectric windows include $Al_2O_3$.

7. The inductively coupled plasma processing apparatus of claim 6, wherein the $Al_2O_3$ is a 99.9% pure material.

8. The inductively coupled plasma processing apparatus of claim 1, further comprising:
   an upper chamber disposed on the lower chamber to cover the plurality of dielectric windows, the metal windows and the high-frequency antenna.

9. The inductively coupled plasma processing apparatus of claim 8, further comprising:
   an anti-deformation frame disposed on the upper chamber; and
   supporting frames supporting the anti-deformation frame.

10. The inductively coupled plasma processing apparatus of claim 1, wherein the high-frequency antenna contacts at least one of the plurality of dielectric windows, and does not contact the metal windows.

11. The inductively coupled plasma processing apparatus of claim 10, wherein a thickness of the plurality of dielectric windows is greater than a thickness of the metal windows.

12. The inductively coupled plasma processing apparatus of claim 1, further comprising:
   a metal frame surrounding the dielectric windows and the metal windows,
   wherein the metal frame includes centrally-located nozzles configured to spray the gases towards the substrate.

13. An inductively coupled plasma processing apparatus, comprising:
   a chamber including an upper chamber and a lower chamber, wherein the lower chamber provides a space for a substrate; and
   a first plane separating the upper chamber from the lower chamber, wherein the first plane includes dielectric windows, metal windows alternatingly arranged with the dielectric windows, a high-frequency antenna configured to generate inductively coupled plasma in the lower chamber and disposed on the dielectric windows, gas inlet pipes respectively disposed in each of the metal windows, and nozzles respectively configured to introduce gases into the lower chamber,
   wherein the dielectric windows and the metal windows extend lengthwise radially along the first plane from a common center.

14. The inductively coupled plasma processing apparatus of claim 13, wherein the space is divided into a centrally-located first zone and a laterally-located second zone at least partially surrounding the first zone, and
   the nozzles include centrally-located nozzles disposed in the first zone, and laterally-located nozzles disposed in the second zone and respectively connected to one of the gas inlet pipes.

15. The inductively coupled plasma processing apparatus of claim 13, wherein an area occupied by the dielectric windows is at least three times greater than an area occupied by the metal windows.

16. The inductively coupled plasma processing apparatus of claim 15, wherein the metal windows include aluminum (Al) coated with a $Y_2O_3$ coating, and
the dielectric windows include $Al_2O_3$, wherein the $Al_2O_3$ is a 99.9% pure material.

17. An inductively coupled plasma processing apparatus comprising:
a substrate support supporting a substrate in a lower chamber;
high-frequency antennas configured to generate inductively coupled plasma in the lower chamber;
a plurality of dielectric windows disposed below the high-frequency antennas, and metal windows disposed between the plurality of dielectric windows to separate the plurality of dielectric windows from each other;
gas inlet pipes disposed in each of the metal windows; and
nozzles connected to each of the gas inlet pipes and configured to spray gases into the lower chamber towards the substrate,.
wherein the plurality of dielectric windows and the metal windows extend lengthwise radially from a common center.

18. The inductively coupled plasma processing apparatus of claim 17, wherein an area occupied by the plurality of dielectric windows is at least three times greater than an area occupied by the metal windows.

19. The inductively coupled plasma processing apparatus of claim 17, wherein the high-frequency antennas contact at least one of the plurality of dielectric windows and do not contact the metal windows.

20. The inductively coupled plasma processing apparatus of claim 17, wherein the high-frequency antennas, the plurality of dielectric windows, the metal windows, the gas inlet pipes and the nozzles are arranged in a first plane separating an upper chamber from the lower chamber, and the inductively coupled plasma processing apparatus further comprises:
side gas inlet pipes disposed on sidewalls of the lower chamber below the first plane, and configured to introduce gases into the lower chamber.

* * * * *